(12) United States Patent
Lee

(10) Patent No.: US 12,349,397 B2
(45) Date of Patent: Jul. 1, 2025

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Byung Hwa Lee, Gamgok-myeon (KR)

(73) Assignee: DB HiTek Co., Ltd., Bucheon-si (KR)

( * ) Notice: Subject to any disclaimer, the term of this patent is extended or adjusted under 35 U.S.C. 154(b) by 609 days.

(21) Appl. No.: 17/739,958

(22) Filed: May 9, 2022

(65) Prior Publication Data
US 2022/0367711 A1 Nov. 17, 2022

(30) Foreign Application Priority Data

May 12, 2021 (KR) .................. 10-2021-0061302

(51) Int. Cl.
| | |
|---|---|
| *H10D 30/65* | (2025.01) |
| *H01L 21/265* | (2006.01) |
| *H01L 21/266* | (2006.01) |
| *H01L 21/761* | (2006.01) |
| *H01L 21/765* | (2006.01) |
| *H10D 30/01* | (2025.01) |
| *H10D 62/10* | (2025.01) |
| *H10D 62/17* | (2025.01) |
| *H10D 64/00* | (2025.01) |

(52) U.S. Cl.
CPC ....... *H10D 30/65* (2025.01); *H01L 21/26513* (2013.01); *H01L 21/266* (2013.01); *H01L 21/761* (2013.01); *H01L 21/765* (2013.01); *H10D 30/0281* (2025.01); *H10D 62/109* (2025.01); *H10D 62/393* (2025.01); *H10D 64/111* (2025.01)

(58) Field of Classification Search
CPC .. H10D 30/65; H10D 64/111; H10D 30/0221; H10D 62/109
See application file for complete search history.

(56) References Cited

U.S. PATENT DOCUMENTS

| | | | |
|---|---|---|---|
| 8,754,474 B2 | 6/2014 | Ko | |
| 2012/0126322 A1 | 5/2012 | Ko | |
| 2016/0372593 A1* | 12/2016 | Yoo | ............... H10D 30/0285 |
| 2019/0334032 A1* | 10/2019 | Ho | ............... H10D 30/0285 |

FOREIGN PATENT DOCUMENTS

KR 10-2012-0055139 A 5/2012

* cited by examiner

*Primary Examiner* — Shih Tsun A Chou
(74) *Attorney, Agent, or Firm* — Andrew D. Fortney; Central California IP Group, P.C.

(57) ABSTRACT

Disclosed is a high voltage semiconductor device and a method of manufacturing the same and, more particularly, to a high voltage semiconductor device and a method of manufacturing the same that enables an improvement in the breakdown voltage relative to the on-resistance by forming a top region in or at the surface of the substrate when the device includes a field plate adjacent to a gate electrode.

10 Claims, 7 Drawing Sheets

HIGH VOLTAGE SEMICONDUCTOR DEVICE AND METHOD OF MANUFACTURING SAME

CROSS REFERENCE TO RELATED APPLICATION(S)

The present application claims priority to Korean Patent Application No. 10-2021-0061302, filed on May 21, 2021, the entire contents of which are incorporated herein by reference.

TECHNICAL FIELD

The present disclosure relates to a high voltage semiconductor device and a method of manufacturing the same and, more particularly, to a high voltage semiconductor device and a method of manufacturing the same enabling improvement of a breakdown voltage relative to an on-resistance by forming a top (e.g., field or depletion implant) region on the surface of a substrate when the device contains a field plate adjacent to a gate electrode.

BACKGROUND ART

A lateral double-diffused metal oxide semiconductor (LDMOS) is a typical power device with fast switching response and high input impedance. Hereinafter, a structure and problems of a semiconductor device having a field plate and a shallow trench isolation (STI) feature in the lower part thereof will be described in detail.

FIG. 1 is a plan view of a conventional high voltage semiconductor device, and FIG. 2 is a cross-sectional view aa' of the high voltage semiconductor device of FIG. 1.

Referring to FIGS. 1 and 2, in the conventional high voltage semiconductor device 9, an insulating pattern 930 is formed on a gate electrode 910, and a field plate 950 is formed on the insulating pattern 930. In such a structure, it is possible to obtain a low on-resistance with the field plate 950, but a breakdown voltage deteriorates accordingly.

In other words, in the conventional structure, an electric field may concentrate on the distal end E1 of the field plate 950 and on the lower end E2 of the gate electrode 910 on the side adjacent to the drain 980. In order to suppress the resulting degradation of the breakdown voltage, the STI 990 extending into the substrate is formed in the lower part of the E1 side. Thanks to the STI 990 feature, the electric field concentration problem on the E1 side may be resolved. However, there is still a difficulty in solving the electric field concentration problem at the lower end E2 of the gate electrode 910. In addition, since the STI 990 feature increases the length of a current path I in the drift region 970, the on-resistance of the device inevitably deteriorates as well. That is, although the field plate 950 improves the on-resistance of the device, the on-resistance deteriorates because of the STI 990 that improves the breakdown voltage.

To solve such a problem, a high voltage semiconductor device having a novel structure and a method of manufacturing the same are disclosed, and the details will be described later.

Document of Related Art

Korean Patent Application Publication No. 10-2012-0055139 "LDMOS SEMICONDUCTOR DEVICE"

SUMMARY OF THE INVENTION

The present disclosure has been made to solve the problems of the related art, and an objective of the present disclosure is to provide a high voltage semiconductor device and a method of manufacturing the same that reduce or prevent deterioration of the on-resistance as a result of an STI feature in a device containing a field plate by including a shallow-depth top region on or at the surface of the substrate.

In addition, an objective of the present disclosure is to provide a high voltage semiconductor device and a method of manufacturing the same that improve the breakdown voltage of the device while preventing the on-resistance from deteriorating, as the top region is below the electric field concentration regions resulting from the field plate, and includes one or more openings that may provide a current path, and reduce or minimize an increase in the length of the current path due to the top region.

Moreover, an objective of the present disclosure is to provide a high voltage semiconductor device and a method of manufacturing the same that improve the on-resistance of the device by providing the top region with a shape that extends along a lower edge of the field plate.

Furthermore, an objective of the present disclosure is to provide a high voltage semiconductor device and a method of manufacturing the same that enhance a reduced surface field (RESURF) effect as the top region extends below the field plate and includes a portion or section extending below the field plate along the first direction.

The present disclosure may be implemented by embodiments having one or more of the following configurations in order to achieve one or more of the above-described objectives.

According to one or more embodiments of the present disclosure, a high voltage semiconductor device includes a substrate; a drift region in the substrate; a body region in the substrate; a drain (which may comprise a first high-concentration impurity) in the drift region; a source (which may comprise a second high-concentration impurity) in the body region; a gate structure including a gate electrode (e.g., to which a gate voltage may be applied), on a surface of the substrate; an insulating pattern extending along a surface of the drift region between the drain and the gate structure and on an upper surface of the gate electrode; a field plate on the insulating pattern; and a top region in the drift region and on or at a surface of the substrate.

According to one or more other or further embodiments of the present disclosure, in the high voltage semiconductor device, the insulating pattern may have a substantially flat bottommost surface.

According to one or more other or further embodiments of the present disclosure, in the high voltage semiconductor device, the top region may have a first end partially overlapping the gate structure, and a second end that does not overlap the drain.

According to one or more other or further embodiments of the present disclosure, in the high voltage semiconductor device, the top region partially may overlap the field plate in a vertical direction below the field plate.

According to one or more other or further embodiments of the present disclosure, in the high voltage semiconductor device, the top region may have a substantially square or rectangular border or shape.

According to one or more other or further embodiments of the present disclosure, a high voltage semiconductor device includes a substrate; a drift region in the substrate, the drift region having a second conductivity type; a body region in the substrate, the body region having a first conductivity type; a drain in the drift region, the drain comprising a high concentration of second conductivity type impurities; a source in the body region, the source comprising the high concentration of second conductivity type impurities; a gate structure including a gate electrode (e.g., to which a gate voltage may be applied), on a surface of the substrate; an insulating pattern extending along a surface of the drift region between the drain and the gate structure and on an upper surface of the gate electrode; a field plate on the insulating pattern; and a top region in the drift region and on or at a surface of the substrate, wherein the top region may have an opening therein.

According to one or more other or further embodiments of the present disclosure, in the high voltage semiconductor device, the top region may overlap a distal end of the field plate on a side adjacent to the drain.

According to one or more other or further embodiments of the present disclosure, in the high voltage semiconductor device, the top region may overlap the gate electrode on a side adjacent to the drain.

According to one or more other or further embodiments of the present disclosure, in the high voltage semiconductor device, the top region may have a side continuously open along a vertical direction as a border of the top region extends along an edge of a lower end of the field plate, and extends from a first end to a second end along a first direction.

According to one or more other or further embodiments of the present disclosure, the high voltage semiconductor device may further include an isolation film defining an active region; and a body contact (e.g., comprising a high concentration of first conductivity type impurities) adjacent to the source.

According to one or more embodiments of the present disclosure, a method of manufacturing a high voltage semiconductor device includes forming an isolation film defining an active region (e.g., of the high voltage semiconductor device) in a surface of a substrate; forming a drift region in the surface of the substrate in the active region; forming a body region in the surface of the substrate in the active region; forming a top region in the drift region; forming a gate structure including a gate electrode on the surface of the substrate; forming a drain in the drift region; forming a source in the body region; forming an insulating pattern on an upper surface of the gate electrode and on a surface of the drift region between the drain and the gate structure; and forming a field plate on the insulating pattern.

According to one or more other or further embodiments of the present disclosure, in the method of manufacturing a high voltage semiconductor device, the top region may have an opening exposing the drift region, and the top region extends along a first direction.

According to one or more other or further embodiments of the present disclosure, in the method of manufacturing a high voltage semiconductor device, the insulating pattern has a bottom surface on the surface of the substrate.

According to one or more other or further embodiments of the present disclosure, in the method of manufacturing a high voltage semiconductor device, the top region may have a first side extending along a second direction that may overlap a distal end of the field plate on a side adjacent to the drain and a second side extending along the second direction that may overlap the gate electrode on the side adjacent to the drain.

According to one or more other or further embodiments of the present disclosure, a method of manufacturing a high voltage semiconductor device includes forming a drift region in the surface of a substrate, the drift region having a second conductivity type; forming a body region in the surface of the substrate, the body region having a first conductivity type; forming a top region in the drift region, the top region having the first conductivity type; forming a gate structure including a gate electrode on the surface of the substrate; forming a drain in the drift region, the drain having the second conductivity type; forming a source in the body region, the source having the second conductivity type; forming an insulating pattern on an upper surface of the gate electrode and on a surface of the drift region between the drain and the gate structure; and forming a field plate on the insulating pattern, wherein forming the top region may comprise an ion implantation process using a mask pattern, the top region may have a border or shape that overlaps an edge of the field plate, and/or the top region may have an inner opening.

According to one or more other or further embodiments of the present disclosure, in the method of manufacturing a high voltage semiconductor device, the top region may have a side extending in a first direction and crosses the field plate (e.g., from or adjacent to the inner opening).

According to one or more other or further embodiments of the present disclosure, in the method of manufacturing a high voltage semiconductor device, the top region may have a shallower depth than the drain.

According to one or more other or further embodiments of the present disclosure, the method of manufacturing a high voltage semiconductor device may further include forming a body contact in the body region, in contact with the source.

Advantageous Effects

The present disclosure has the following effects by the above configurations.

The present disclosure can reduce or prevent deterioration of the on-resistance as a result of the STI feature intended to prevent electric field concentration caused by a field plate by forming a shallow-depth top region on the surface of a substrate in the high voltage semiconductor device having the field plate.

In addition, the present disclosure can improve the breakdown voltage of the device while preventing the on-resistance from deteriorating as the top region is below the electric field concentration regions resulting from the field plate, and extends in a first direction and includes an opening providing a current path, thereby reducing or minimizing an increase in the length of the current path due to the formation of the top region.

Moreover, the present disclosure can improve the on-resistance of the device by providing the top region with a shape that extends along the field plate or a lower edge thereof.

Furthermore, the present disclosure can enhance the RESURF effect as the top region extends along the field plate and includes a portion or section extending across the field plate along the first direction.

Meanwhile, it should be added that even if effects are not explicitly mentioned herein, the effects described in the following specification expected by the technical features of the present disclosure and their potential effects are treated as if they were described in the present disclosure.

DETAILED DESCRIPTION

Figure 1:
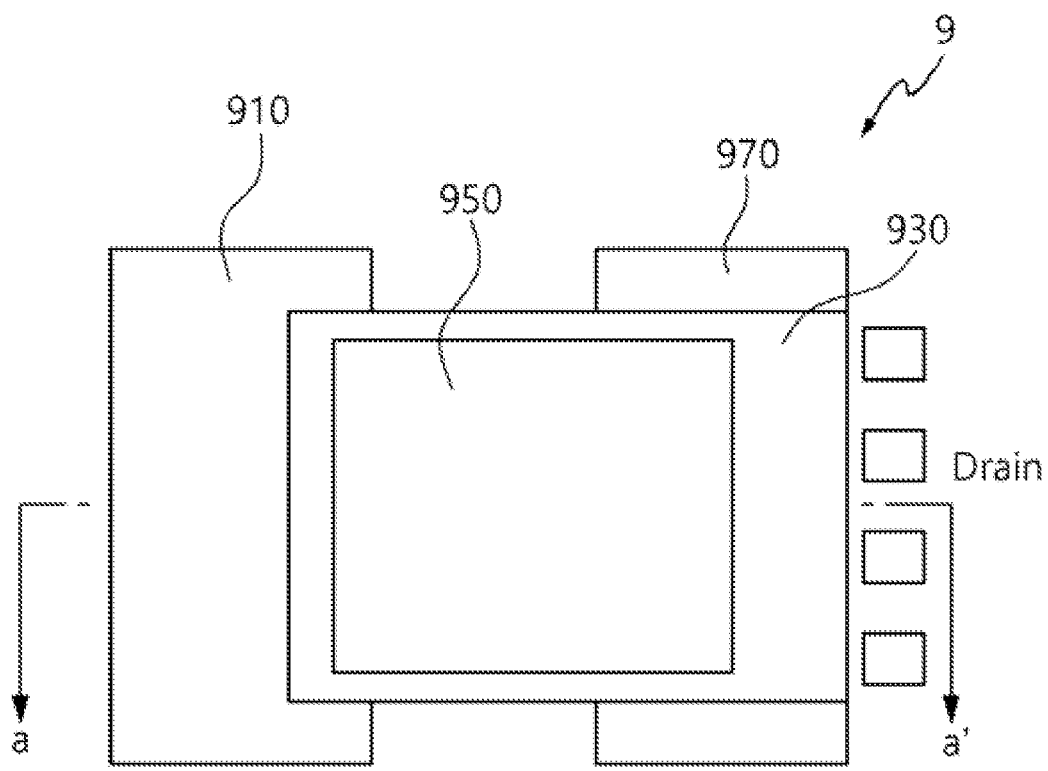
FIG. 1 is a plan view of a conventional high voltage semiconductor device.

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the claims. In addition, these embodiments are provided for reference in order to more completely explain the present disclosure to those skilled in the art.

Hereinafter, it should be noted that when one component (or layer) is described as being on another component (or layer), the component may be directly on another component, or one or more third components or layers may be between the one component and the other component. In addition, when one component is expressed as being directly on or above another to component, no other component(s) are located between the one component and the other component. Moreover, the terms "top", "upper", "lower", "above", "below," "bottom" or "one (first) side" or "(an) other side" of a component may refer to a relative positional relationship.

The terms first, second, third, etc. may be used to describe various items such as various components, regions and/or parts. However, the items are not limited by these terms.

In addition, it should be noted that, where certain embodiments are otherwise feasible, certain process sequences may be performed other than those described below. For example, two processes described in succession may be performed substantially simultaneously or in the reverse order.

The term "metal oxide semiconductor" (MOS) used below is a general term. For example, "metal" or "M" is not limited to only metal, and it may refer to any of various types of conductors. Also, "semiconductor" or "S" may refer to a substrate or a semiconductor structure. The term "oxide" or "O" is not limited to oxide, and may include various types of organic or inorganic dielectric or insulating materials.

Moreover, the conductivity type of a doped region or component may be defined as "p-type" or "n-type" according to the main carrier characteristics, but this is only for convenience of description, and the technical spirit of the present disclosure is not limited to what is illustrated. For example, hereinafter, "p-type" or "n-type" will be replaced with the more general terms "first conductivity type" or "second conductivity type." Here, the first conductivity type may refer to p-type, and the second conductivity type may refer to n-type.

Furthermore, it should be understood that "high-concentration" and "low-concentration," referring to the concentration of the impurity in a certain region, may refer to the concentration of dopant in one region or component relative to another region or component.

Hereinafter, for convenience of description, the x-axis direction of the device is referred to as a first direction, and the y-axis direction is referred to as a second direction.

Figure 3:
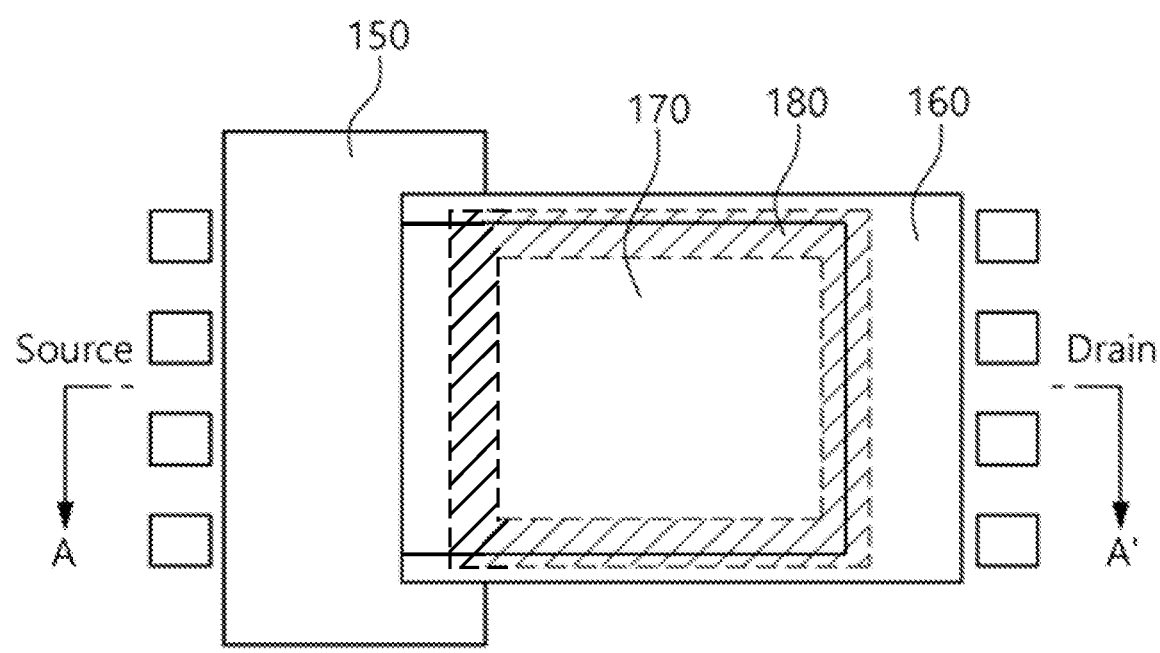
FIG. 3 is a plan view of a high voltage semiconductor device according to one or more embodiments of the present disclosure.
Figure 4:
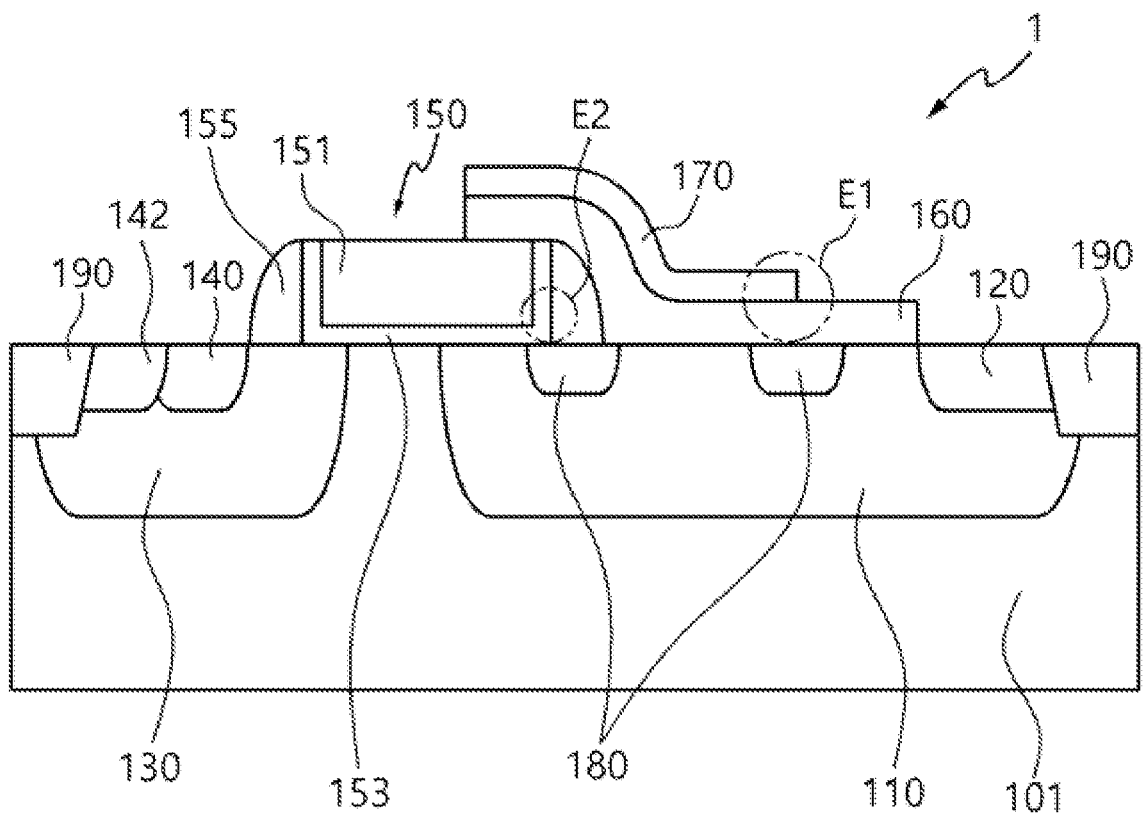
FIG. 4 is a cross-sectional view of the high voltage semiconductor device of FIG. 3 along the line A-A'.

FIG. 3 is a plan view of a high voltage semiconductor device according to an embodiment of the present disclosure, and FIG. 4 is a cross-sectional view of the high voltage semiconductor device of FIG. 3 along the line A-A'. In FIG. 3, the isolation film 190 is not shown for convenience of explanation.

Hereinafter, a high voltage semiconductor device according to one or more embodiments of the present disclosure will be described in detail with reference to the accompanying drawings. The semiconductor device described in the present disclosure may be, for example, an LDMOS device, and more specifically, an NLDMOS device.

Referring to FIGS. 3 and 4, the present disclosure relates to a high voltage semiconductor device 1 and, more particularly, to a high voltage semiconductor device 1 enabling an improvement in the breakdown voltage relative to the on-resistance by including a top region in or at the surface of a substrate and a field plate on and/or adjacent to a gate electrode.

First, a well region (not shown) that may define an active region of the device 1 is on a substrate 101. The active region may be additionally or alternatively defined by an isolation film 190. The substrate 101 may be or comprise a p-type substrate, and a p-type or n-type epitaxial layer may optionally be on the substrate 101. When the epitaxial layer is present, a drift region 110 and a body region 130, which will be described later, may be in (e.g., on or at the uppermost surface of) the epitaxial layer.

The drift region 110 may be in (e.g., on or at the uppermost surface of) the substrate 101. The drift region 110 may have a second conductivity type and a relatively low impurity concentration. In addition, the drift region 110 may surround a drain 120. When the doping concentration in the drift region 110 is below a certain level, the on-resistance (Rsp) deteriorates. On the contrary, when the doping concentration is above a certain level, the on-resistance (Rsp) is improved, but the breakdown voltage (BV) deteriorates. Thus, it is desirable for the drift region 110 to have an appropriate level or concentration of dopant in consideration of these characteristics. It is more preferable that the doping concentration of the drift region 110 is lower than that of the drain 120.

The drain 120 is in the drift region 110, and may be on or at an uppermost surface of the drift region 110. The drain 120 may be or comprise a high concentration of impurities having the second conductivity type and a relatively higher impurity concentration than that of the drift region 110. Additionally, the drain 120 may be electrically connected to a drain electrode (not shown).

The body region 130 may be in (e.g., on or at the uppermost surface of) the substrate 101 on the side of the gate structure 150 opposite from the drift region 110. The body region 130 may comprise first conductivity type impurities. The source 140 may be in the body region 130, for example, on or at the uppermost surface of the body region 130. The source 140 may comprise a high concentration of second conductivity type impurities. In addition, a body contact 142, which comprises a high concentration of first conductivity type impurities, may be in the body region 130, adjacent to the source 140 or in contact with the source 140. The source 140 may be electrically connected to a source electrode (not shown).

In addition, a gate structure 150 is on the surface of the substrate 101, and in detail, the gate structure 150 may be between the drain 120 and the source 140. The gate structure 150 is on or over a channel region. The gate structure 150 may include a gate electrode 151 to which a gate voltage may be applied to turn on/off the flow of carriers through the channel region; a gate insulating film 153 between the gate electrode 150 and the surface of the substrate 101; and a gate spacer 155 on a side surface of the gate electrode 151 and the gate insulating film 153.

The gate electrode 151 may comprise conductive polysilicon, a metal, a conductive metal nitride, or a combination thereof, and may be formed by chemical vapor deposition (CVD), physical vapor deposition (PVD), atomic layer deposition (ALD), metal-organic ALD (MOALD), or metal-organic CVD (MOCVD), etc. The gate insulating film 153 may comprise a silicon oxide film, a high-k film, or a combination thereof, and may be formed by thermal oxidation, ALD, CVD, or PVD. The gate spacer 155 may comprise an oxide film (e.g., silicon dioxide), a nitride film (e.g., silicon nitride), or a combination thereof.

In addition, an insulating pattern 160 may be on the drift region 110 and may have one end that partially overlaps the upper surface of the gate electrode 151. To be specific, one end of the insulating pattern 160 is on the upper surface of the gate electrode 151, and a remainder of the insulating pattern 160 may extend over the drift region 110, toward the drain 120. Like the gate insulating film 153, the insulating pattern 160 may also comprise a silicon oxide layer, a high-k film, or a combination thereof, but is not limited thereto.

A field plate 170 may be on the insulating pattern 160 and have a complementary shape to the upper surface of the insulating pattern 160. The field plate 170 may be on or over a part of the gate structure 150 and on or over the drift region 110 (or a part thereof). To be specific, the field plate 170 may have one end overlapping the gate structure 150 and another (opposite) end on the drift region 110, but that does not overlap the drain 120.

In addition, a top (e.g., field or depletion implant) region 180 having the first conductivity type (e.g., a p-top region or layer) is in the drift region 110 and/or in (e.g., at the uppermost surface of) the substrate 101. The top region 180 may be between the drain 120 and the source 140. To be specific, the top region 180 may at least partially overlap the field plate 170. In at least one embodiment, the top region 180 overlaps part of the periphery (e.g., sidewalls) of the field plate 170 in or over the drift region 110, and a sidewall of the gate structure 150 nearest or adjacent to the drain 120.

Hereinafter, the structure of a conventional high voltage semiconductor device 9 and problems associated therewith, and the structure of the present high voltage semiconductor device to solve these problems will be described in detail.

Figure 2:
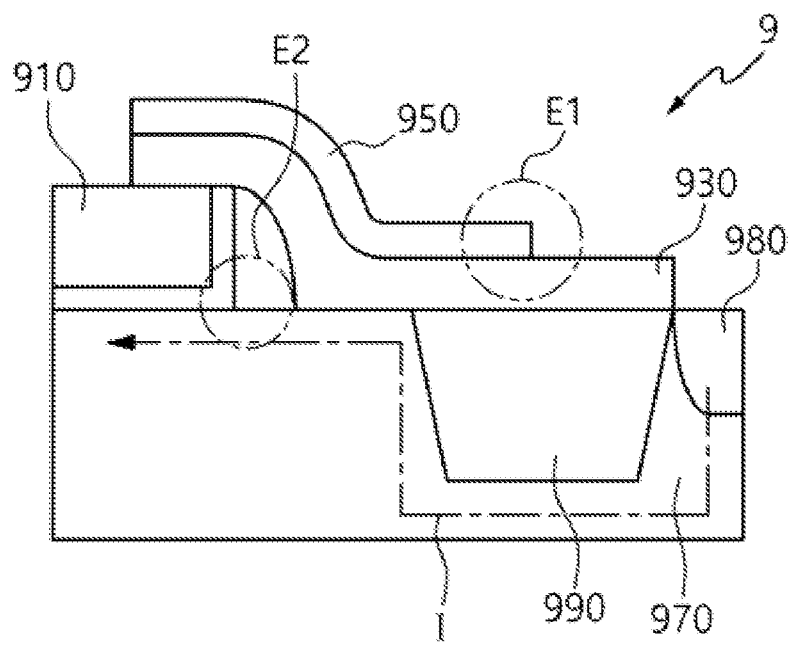
FIG. 2 is a cross-sectional view of the high voltage semiconductor device of FIG. 1 along the line a-a'.

Referring to FIGS. 1 and 2, in the conventional high voltage semiconductor device 9, an insulating pattern 930 is on a gate electrode 910, and a field plate 950 is on the insulating pattern 930. In such a structure, it is possible to obtain a low on-resistance with the field plate 950, but the breakdown voltage deteriorates accordingly.

In other words, in the conventional structure, an electric field concentration may occur on the distal side E1 of the field plate 950 adjacent to the drain 980 and below the lower end or side E2 of the gate electrode 910 adjacent to the drain 980. In order to suppress the resulting degradation of the breakdown voltage, the STI 990 is below the distal side E1 of the field plate 950. Thanks to this STI 990 feature, the electric field concentration problem at the distal side E1 of the field plate 950 may be resolved. However, there is still a difficulty in solving the electric field concentration problem below the lower end or side E2 of the gate electrode 910. In addition, since the STI 990 feature increases the length of the current path T in the drift region 970, the on-resistance of the device inevitably deteriorates as well. That is, although the field plate 950 improves the on-resistance of the device 9, the on-resistance deteriorates because of the STI 990.

In order to solve such problems, referring to FIGS. 3 and 4, the high voltage semiconductor device 1 according to the present disclosure may not have an STI feature below the field plate 170. In addition, the top region 180 is in the drift region 110 and/or in (e.g., at the surface of) the substrate 101. The top region 180 provides a reduced surface field (RESURF) effect.

The top region 180 may have a shallower depth than the adjacent drain 120 or the source 140. Also, it is preferable that the top region 180 at least partially overlap the field plate 170 in the vertical direction below the field plate 170. To be specific, it is more preferable that the top region 180 at least overlap the distal end E1 of the field plate 170 (e.g., on the side of the field plate 170 adjacent to the drain 130) and/or a lower end E2 or sidewall of the gate electrode 151 on the side adjacent to the drain 120. That is, the top region 180 may overlap in the vertical direction at least with the regions E1 and E2 where the electric field concentration occurs.

Figure 5:
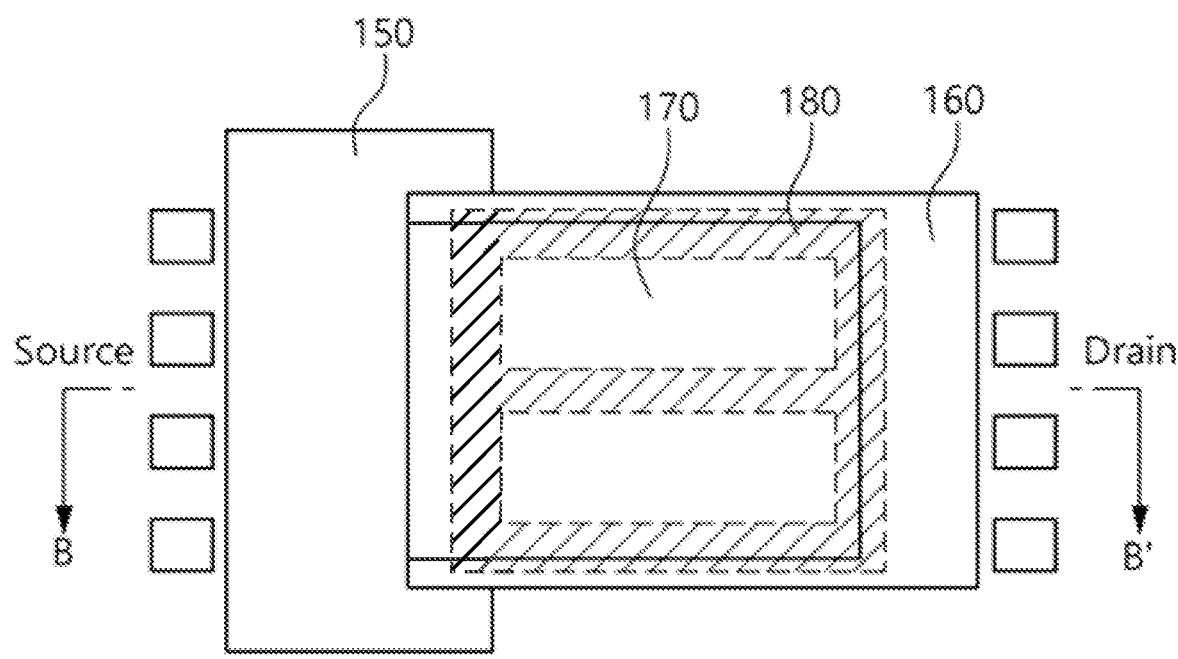
FIG. 5 is a plan view of a high voltage semiconductor device according to one or more other embodiments of the present disclosure.
Figure 6:
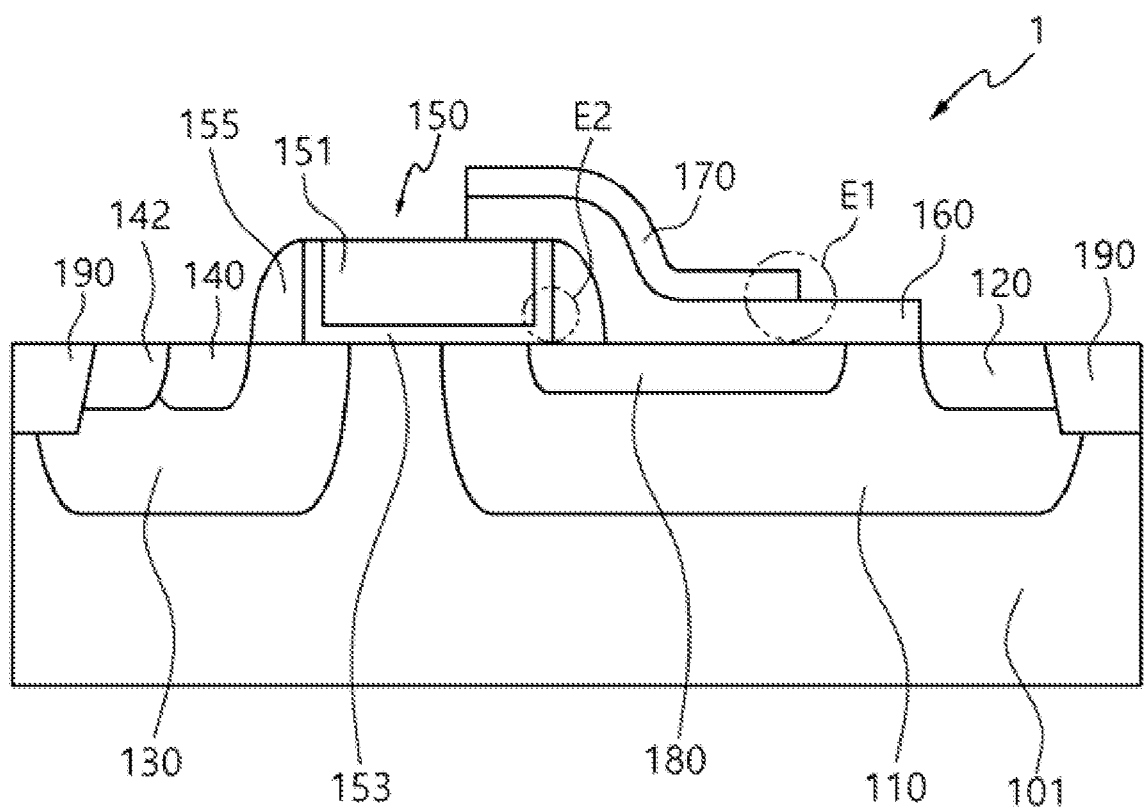
FIG. 6 is a cross-sectional view of the high voltage semiconductor device of FIG. 5 along the line B-B'.

FIG. 5 is a plan view of a high voltage semiconductor device according to one or more other or further embodiments of the present disclosure, and FIG. 6 is a cross-sectional view of the high voltage semiconductor device of FIG. 5 along the line B-B'.

As an example, referring to FIGS. 3 and 4, the top region 180 is under the field plate 170 and overlaps part of the field plate 170. For example, the top region 180 may have a square or rectangular border or shape in the top-down view, with one or more openings therein. The drift region 110 is in the opening(s).

As another example, referring to FIGS. 5 and 6, the top region 180 overlaps the field plate 170 and is under the field plate 170, and may have a section crossing the field plate 170 along the first direction (e.g., between two openings). For example, two rectangular openings may be along the second direction. Accordingly, the RESURF effect may increase compared to the embodiment of FIGS. 3-4.

The top region 180 advantageously overlaps at least regions E1 and E2. This is because, when the top region 180 has a square or rectangular shape with no openings therein, the on-resistance decreases due to the re-increase in the length of the current path I.

FIGS. 7 to 12 are reference cross-sectional views for explaining a method of manufacturing a high voltage semiconductor device according to one or more embodiments of the present disclosure.

Hereinafter, a method of manufacturing a high voltage semiconductor device according to the present disclosure will be described in detail with reference to the accompanying drawings. It should be noted that the sequence for manufacturing each component may be different from that described herein, and certain components may be formed substantially simultaneously.

Figure 7:
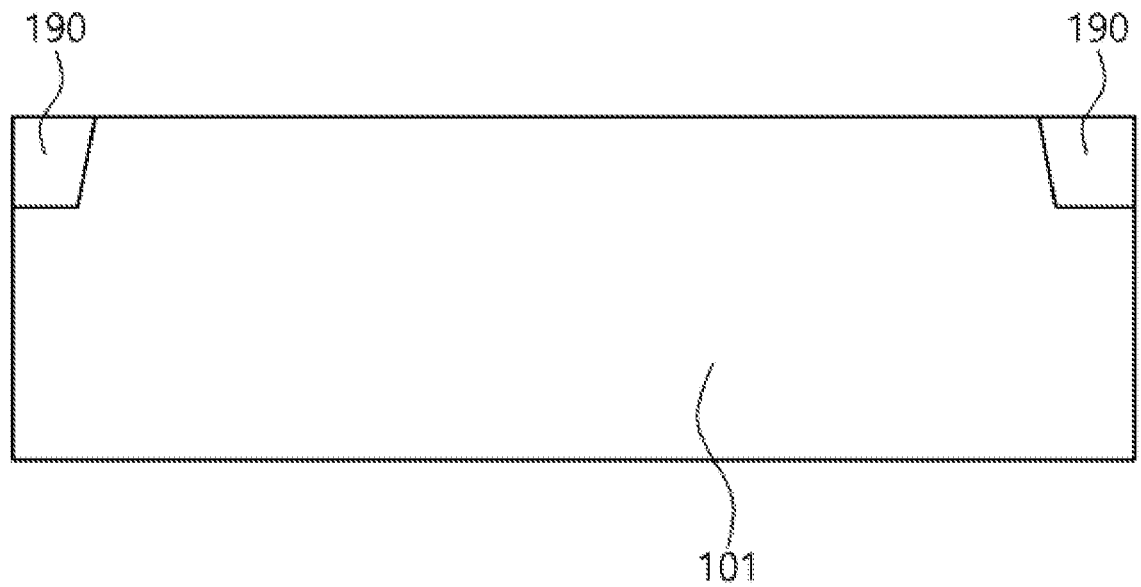
FIGS. 7 to 12 are reference cross-sectional views for explaining a method of manufacturing a high voltage semiconductor device according to one or more embodiments of the present disclosure.

First, referring to FIG. 7, the isolation film 190 for defining the active region is formed in the substrate 101 at the surface thereof. The isolation film 190 may be formed by a shallow trench isolation (STI) process. Optionally, prior to forming the isolation film 190, the method may comprise forming an epitaxial layer (e.g., of silicon) on a single-crystal silicon substrate, by conventional epitaxial growth (e.g., from silane gas).

Figure 8:
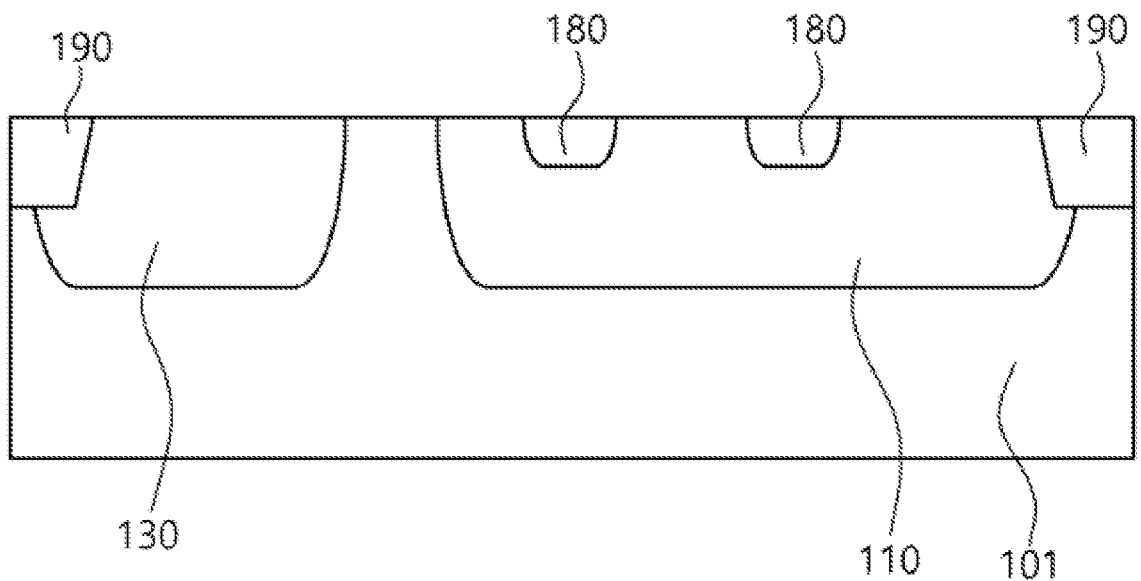

In addition, referring to FIG. 8, the drift region 110 may be formed in the active region (at the surface of the substrate 101), and the body region 130 may be formed in the drift region 110. To be specific, after forming the isolation film 190, the drift region 110 having the second conductivity type and the body region 130 having the first conductivity type may be formed by separate ion implantation processes. As previously mentioned, when the epitaxial layer is on the substrate 101, the drift region 110 and the body region 130 may be formed on, in or at the surface of the epitaxial layer. The space in the active layer between the drift region 110 and the body region 130 may form the channel of the device 1.

In addition, the top region 180 is formed in the drift region 110. For example, the top region 180 (e.g., an impurity region having the first conductivity type) may be formed by ion implantation using a mask pattern (not shown) on the substrate 101. As previously mentioned, the top region 180 may have, for example, a shape such as a square or rectangle, and may include one or more (e.g., two) square or rectangular openings therein. The dopant for the top region 180 may be implanted into the drift region 110 at a dose or concentration higher than that of the drift region 110, but at a relatively low energy.

Figure 9:
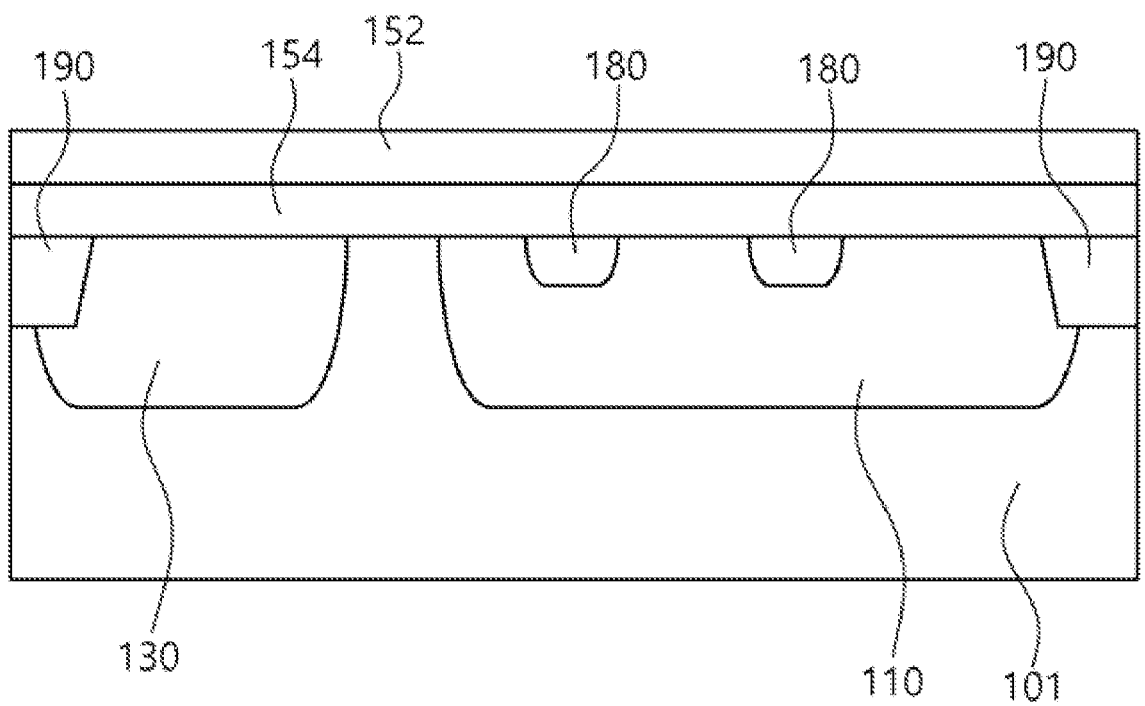
Figure 10:
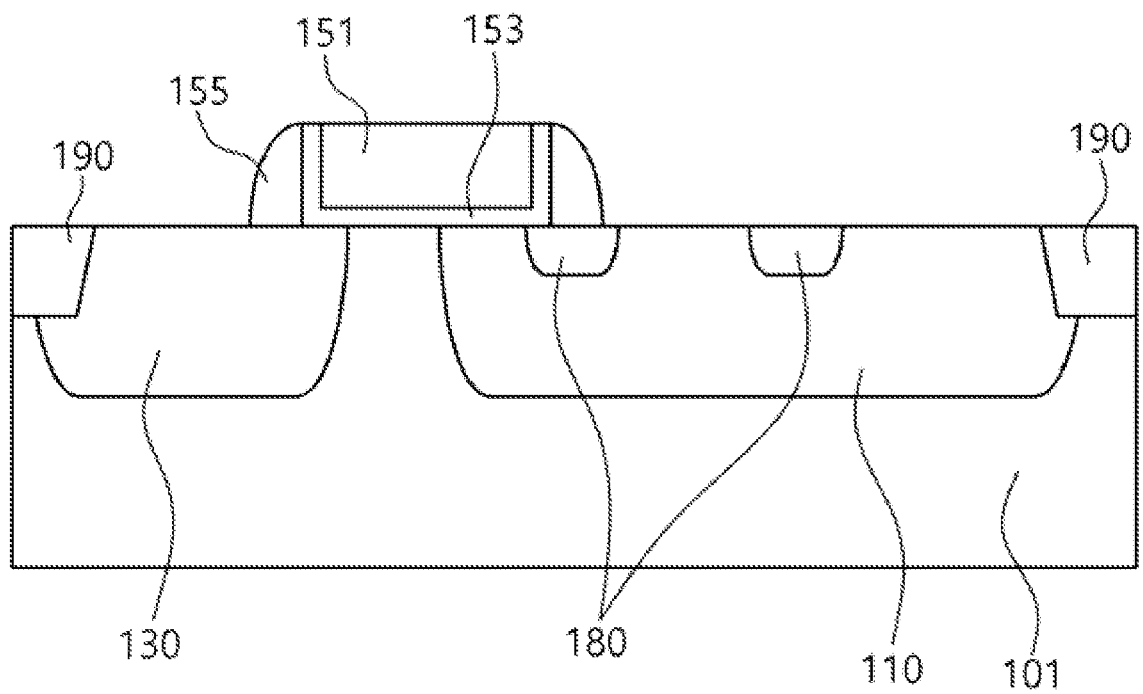

Thereafter, referring to FIG. 9, the gate structure 150 is formed on the surface of the substrate 101 in the active region, generally overlapping the space between the drift region 110 and the body region 130. For example, an insulating film 154 comprising a silicon oxide (e.g., a thermally-grown silicon dioxide film) or the like is formed on the surface of the substrate 101, and a gate film 152 comprising, for example, a conductive polysilicon film is deposited on the insulating film 154. Then, referring to FIG. 10, after a mask pattern (not shown) for forming the gate electrode 151 is formed on the gate film 152, the gate film 152 and the insulating film 154 are sequentially etched to form the gate electrode 151 and the gate oxide 153. Next, one or more sidewall insulating films are conformally deposited on the gate electrode 151 and the substrate 101 by, for example, a chemical vapor deposition (CVD) process, and the sidewall insulating film(s) are anisotropically dry etched to form gate spacers 155 on sidewalls of the gate electrode 151.

Figure 11:
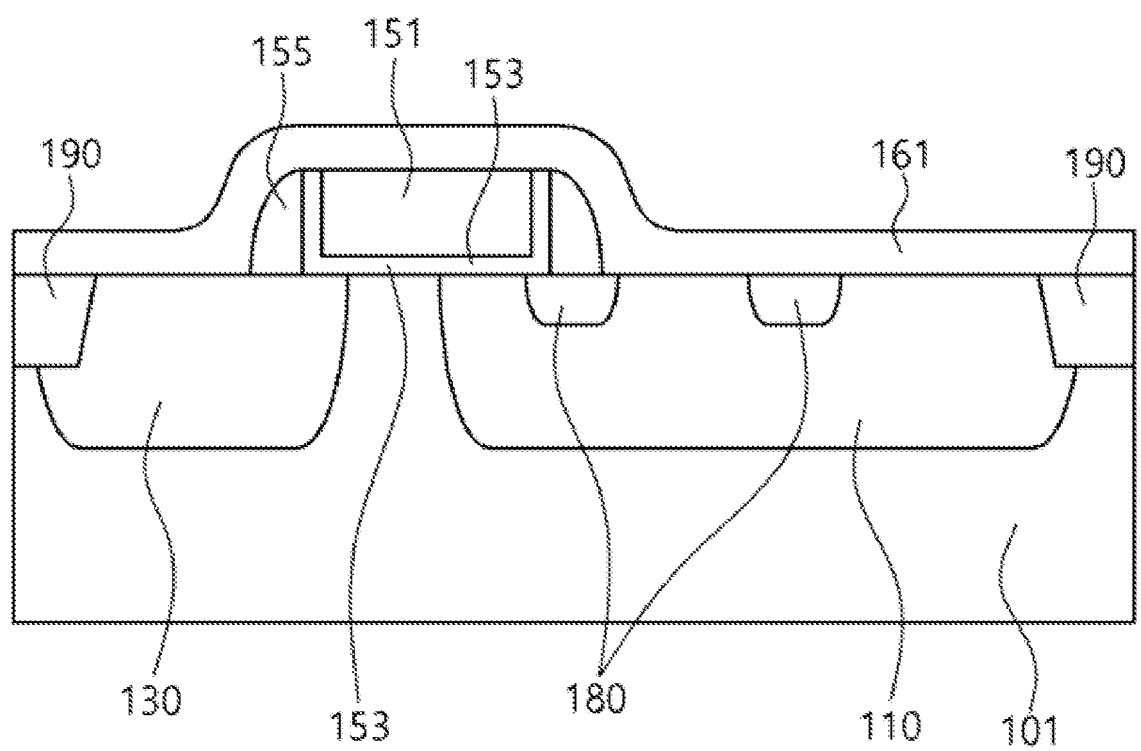

Thereafter, referring to FIG. 11, an insulating film 161 for forming the insulating pattern 160 is deposited on the gate electrode 151 and the substrate 101. The insulating film 161 may comprise an insulating material, such as a doped or undoped silicon dioxide film, and may be deposited by CVD, PVD, etc., but is not limited thereto. Then, the insulating film 161 is etched (e.g., by conventional dry etching) using a mask pattern (not shown) to form the insulating pattern 160 (FIG. 12).

Figure 12:
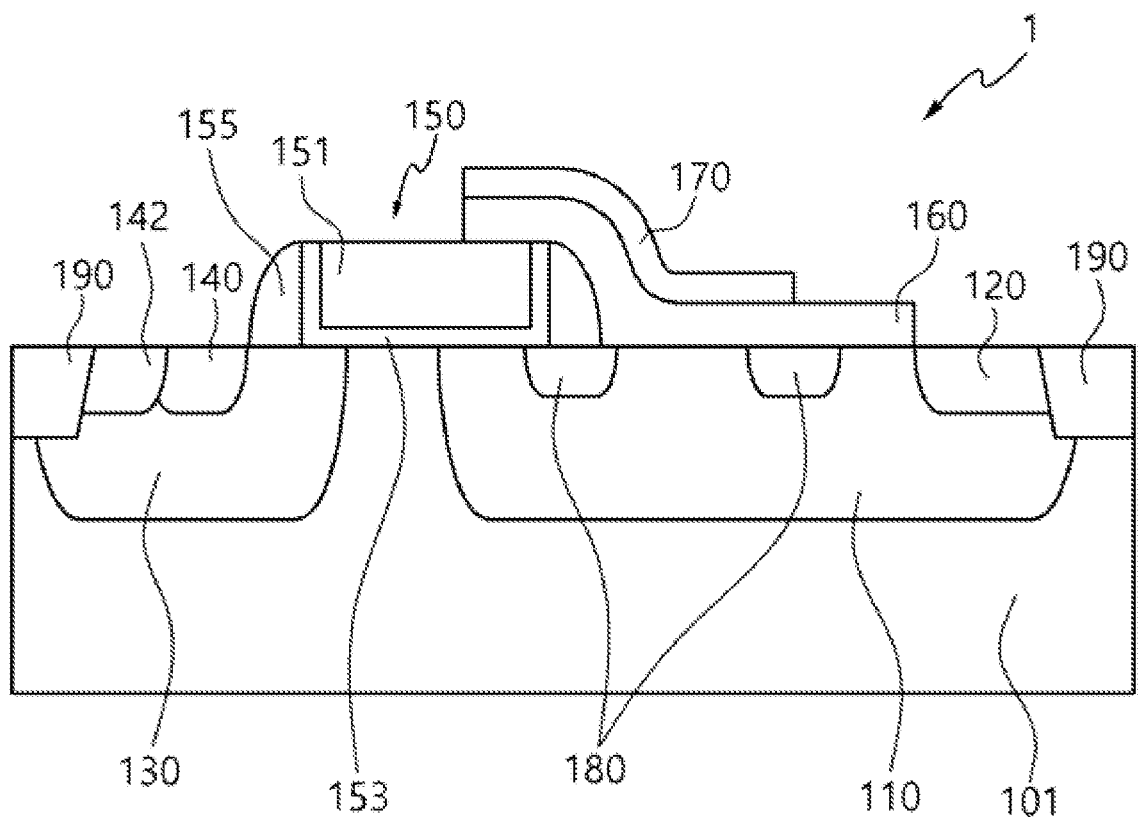

Thereafter, referring to FIG. 12, the field plate 170 may be formed by depositing a polysilicon film on the insulating pattern 160 and etching the polysilicon film using a mask pattern (not shown).

Thereafter, the drain 120, the source 140, and the body contact 142 are formed. For example, the drain 120 and the source 140 may be formed by an ion implantation process using the gate structure 150, the field plate 170 and the insulating pattern 160 (and optionally a corresponding mask pattern) as a mask. The body contact 142 may be formed by a separate ion implantation process using a corresponding mask pattern (not shown) as a mask.

In addition, a self-aligned silicide (Salicide) process for forming a silicide film (not shown) on the drain 120, the source 140 and/or the body contact 142 may be performed using a metal film such as cobalt (Co), nickel (Ni), tungsten (W) or titanium (Ti) for improved contact resistance and thermal stability.

The above detailed description is illustrative of the present disclosure. In addition, the above description shows and describes various embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiments describe various states for implementing the technical idea(s) of the present disclosure, and various changes for specific application fields and uses of the present disclosure are possible. Accordingly, the detailed description of the present disclosure is not intended to limit the present disclosure to the disclosed embodiments.

The invention claimed is:

1. A high voltage semiconductor device, comprising:
   a substrate;
   a drift region in the substrate;
   a body region in the substrate;
   a drain in the drift region;
   a source in the body region;
   a gate structure including a gate electrode on a surface of the substrate, wherein the body region and the drift region are on opposite sides of the gate structure;
   an insulating pattern extending along a surface of the drift region between the drain and the gate structure and on an upper surface of the gate electrode;
   a field plate on the insulating pattern; and
   a top region within the drift region, below the insulating pattern, between the drain and the source, and on or at a surface of the substrate, wherein the top region has a first end partially overlapping the gate structure, and a second end that does not overlap the drain.

2. The high voltage semiconductor device of claim 1, wherein the insulating pattern has a flat bottommost surface.

3. The high voltage semiconductor device of claim 2, wherein the top region partially overlaps the field plate in a vertical direction below the field plate.

4. The high voltage semiconductor device of claim 2, wherein the top region has a square or rectangular border or shape.

5. A high voltage semiconductor device, comprising:
   a substrate;
   a drift region in the substrate, the drift region having a second conductivity type;
   a body region in the substrate, the body region having a first conductivity type;
   a drain in the drift region, the drain comprising first impurities having the second conductivity type;
   a source in the body region, the source comprising second impurities having the second conductivity type;
   a gate structure including a gate electrode on a surface of the substrate, wherein the body region and the drift region are on opposite sides of the gate structure;
   an insulating pattern extending along a surface of the drift region between the drain and the gate structure and on an upper surface of the gate electrode;
   a field plate on the insulating pattern; and a top region in the drift region, below the insulating pattern, between the drain and the source, and on or at a surface of the substrate, wherein the top region has an opening therein.

6. The high voltage semiconductor device of claim 5, wherein the top region overlaps a distal end of the field plate on a side of the gate electrode adjacent to the drain.

7. The high voltage semiconductor device of claim 5, wherein the top region overlaps the gate electrode on a side of the gate electrode adjacent to the drain.

8. The high voltage semiconductor device of claim 5, further comprising:

an isolation film defining an active region; and a body contact adjacent to the source, the body contact comprising first conductivity type impurities.

9. The high voltage semiconductor device of claim 5, wherein the top region overlaps the field plate, and has a section crossing under the field plate along a first direction from the source to the drain.

10. The high voltage semiconductor device of claim 9, wherein the top region has two rectangular openings along a second direction orthogonal to the first direction.

* * * * *